US007129181B2

(12) United States Patent
Liu et al.

(10) Patent No.: US 7,129,181 B2
(45) Date of Patent: Oct. 31, 2006

(54) SUB-RESOLUTION GAPS GENERATED BY CONTROLLED OVER-ETCHING

(75) Inventors: JengPing Liu, San Jose, CA (US); Jackson H. Ho, Palo Alto, CA (US); Chinnwen Shih, Santa Clara, CA (US); Michael L. Chabinyc, Burlingame, CA (US); William S. Wong, San Carlos, CA (US)

(73) Assignee: Palo Alto Research Center Incorporated, Palo alto, CA (US)

( * ) Notice: Subject to any disclaimer, the term of this patent is extended or adjusted under 35 U.S.C. 154(b) by 0 days.

(21) Appl. No.: 10/943,624

(22) Filed: Sep. 17, 2004

(65) Prior Publication Data

US 2006/0063369 A1 Mar. 23, 2006

(51) Int. Cl.
*H01L 21/302* (2006.01)

(52) U.S. Cl. .............................. 438/739; 257/E21.219

(58) Field of Classification Search ................ 438/689, 438/717, 736–739, 706, 707, 710, 718, 735, 438/924, 942, FOR. 108; 257/E21.219, 257/E21.246; 977/856

See application file for complete search history.

(56) References Cited

U.S. PATENT DOCUMENTS

| | | | | |
|---|---|---|---|---|
| 5,462,884 | A * | 10/1995 | Taniguchi | 438/286 |
| 6,355,538 | B1 * | 3/2002 | Tseng | 438/424 |
| 2002/0164884 | A1 * | 11/2002 | Lishan | 438/739 |

* cited by examiner

*Primary Examiner*—Brook Kebede
(74) *Attorney, Agent, or Firm*—Bever, Hoffman & Harms, LLP; Patrick T. Bever

(57) ABSTRACT

Controlled overetching is utilized to produce metal patterns having gaps that are smaller than the resolution limits of the feature patterning (e.g., photolithography) process utilized to produce the metal patterns. A first metal layer is formed and masked, and exposed regions are etched away. The etching process is allowed to continue in a controlled manner to produced a desired amount of over-etching (i.e., undercutting the mask) such that an edge of the first metal layer is offset from an edge of the mask by a predetermined gap distance. A second metal layer is then deposited such that an edge of the second metal layer is spaced from the first metal layer by the predetermined gap distance. The metal gap is used to define, for example, transistor channel lengths, thereby facilitating the production of transistors having channel lengths defined by etching process control that are smaller than the process resolution limits.

20 Claims, 10 Drawing Sheets

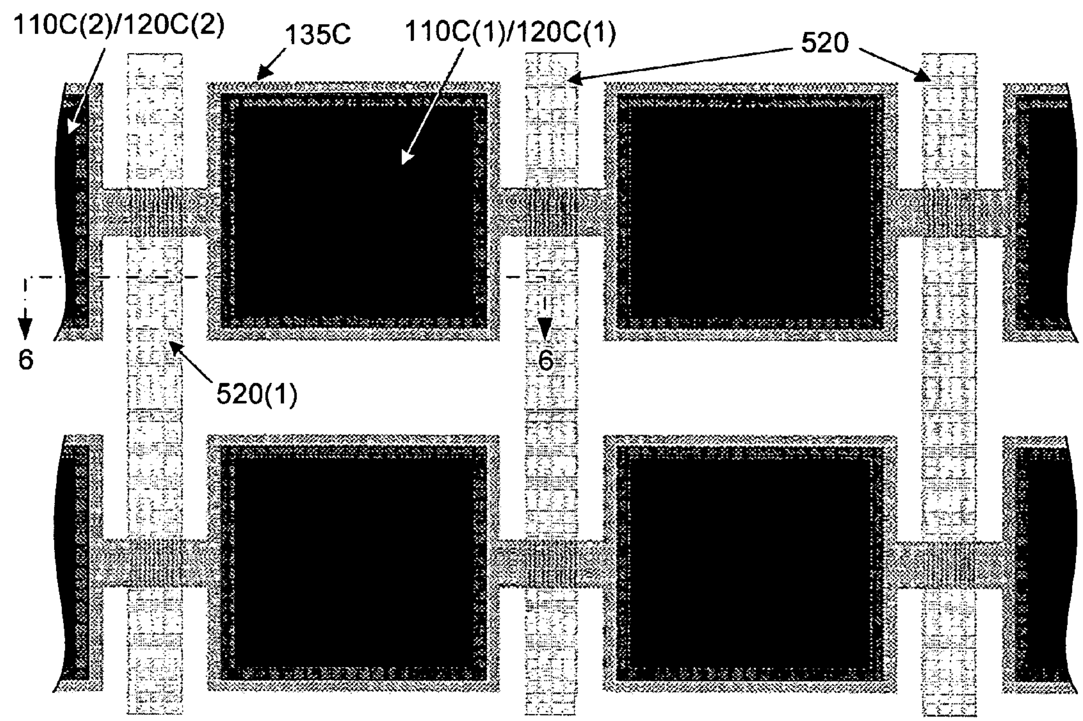
FIG. 5
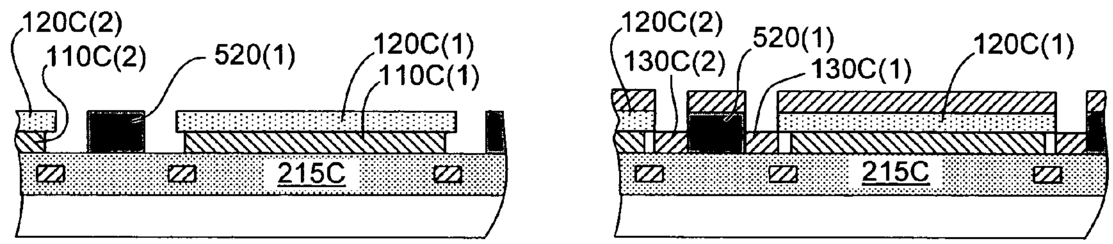
FIG. 6(A)
FIG. 6(B)
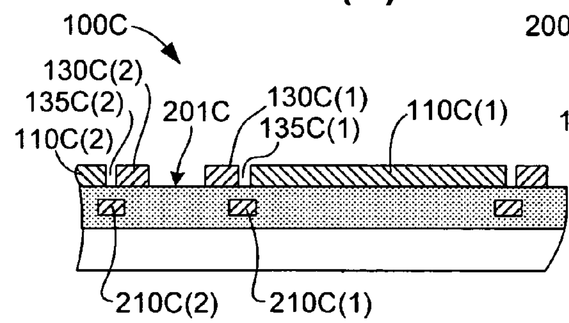
FIG. 6(C)
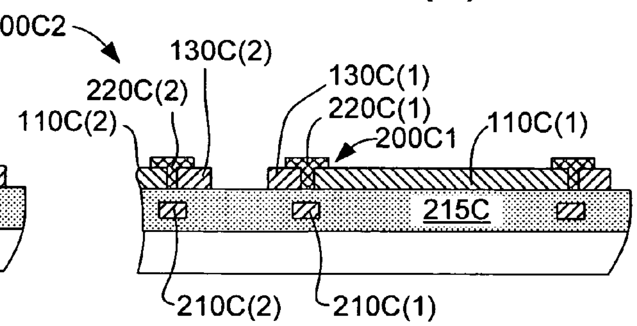
FIG. 6(D)

SUB-RESOLUTION GAPS GENERATED BY CONTROLLED OVER-ETCHING

FIELD OF THE INVENTION

This invention generally relates to feature patterning techniques utilized in the production of integrated circuits, and more particularly to methods for forming sub-resolution integrated circuit structures utilizing low-resolution feature patterning techniques.

BACKGROUND OF THE INVENTION

Scaling down transistor channel lengths is the most important ingredient fueling the last twenty years progress of semiconductor industry. The width-to-length (W/L) ratio of transistors is directly proportional to the transistors on-current. The channel length L is a more important parameter in typical scaling rules since the circuit switch speed can be scaled down with smaller length L but not with larger width W.

However, conventional methodology in semiconductor industry of scaling down transistor channel lengths is to use high-resolution lithography tool to define transistor critical dimensions (e.g., gate length, source/drain separations) with their finest resolution. The shortest channel length is therefore directly limited by the tools, and it is very difficult and expensive to realize high resolution lithography tools for large-area process. Current multi-million large area lithography tools for LCD back-plane manufacturing have typical resolution limits around 2 μm, which is more than one orders of magnitude larger than the state-of-the-art photolithography tool designed for crystalline Si industry. The recent development of feature patterning techniques based on patterning technology has even lower resolution limits, e.g., about 40 um for wax inkjet printing technique, 100 um for screen printing technique, 100 um for PCB dry film resist technique.

There are a few high resolution, relatively low cost un-conventional feature patterning techniques under development that rely on contact pattern transferring, which must be carefully studied for the known problems of contact pattern transferring such as mask life time and particle defect propagation before these methods can be adopted by the industry.

Another conventional technique for scaling down transistor channel length without using high resolution lithography is the formation of vertical transistor structures. This methodology claims to use layer thickness, which is the most controllable dimension in the large area process, to define transistor channel length. However, the problems of most proposed vertical transistor structures are the large parasitic capacitance and parasitic conductance between source and drain contacts, caused by the overlap of source and drain electrodes, which are defined by the resolution of lithography tools.

What is needed is a highly reliable method for producing integrated circuits having high resolution features using relatively low resolution feature patterning (e.g., lithography) tools that is both economical and reliable.

SUMMARY OF THE INVENTION

The present invention is directed to a method for producing a fabricated pattern (e.g., a metal pattern or structure) in which a first layer is subjected to controlled under-cutting (over-etching), and then the etch mask is used to align a second layer such that the first and second layers are separated by the under-cut distance. Under-cut control during etching is an important issue the photolithographic fabrication industry, and as such is highly developed. For example, in thin film transistor (TFT) fabrication lines, undesirable under-cutting is routinely limited to less than one micron (1 μm), which is less than the typical resolution limit (i.e., about 2 μm) of current multi-million large area lithographic tools for manufacturing back-planes for liquid crystal displays (LCDs). Conversely, when under-cutting of up to several hundred microns is desired, such as in the production of microelectromechanical system (MEMS) structures, well-established techniques are used to generate these under-cut distances with a high level of reliably and accuracy. The present invention recognizes that these well-established under-cut control techniques can be utilized to define structural features that are independent of the feature patterning (e.g., lithographic) tool resolution, thus facilitating the production sub-resolution features in a manner that should be readily adopted by the integrated circuit fabrication industry.

In accordance with a general embodiment of the present invention, the fabrication process includes forming a first layer on a surface, forming a mask on the first layer, etching and under-cutting the first layer through a window in the mask until an edge of the first layer is offset from an edge of the mask by a predetermined under-cut distance, and then depositing a second layer onto the surface through the window such that an edge of the second layer is aligned with the edge of the mask, thereby forming a gap between the first and second layers that is equal to the under-cut distance (i.e., based on the etching process, not on the resolution of the feature patterning tool). The mask is subsequently removed to expose the gap. Accordingly, a pattern is formed that can be utilized, for example, to form an electrical element or micromechanical structure. Because the controlled under-cutting process is entirely independent of the feature patterning tool used, for example, to define the mask window, the present invention provides a highly reliable method to produce sub-resolution pattern features (i.e., features that are smaller that the resolution limits of the feature patterning tool).

In accordance with a first aspect of the present invention, the pattern generated by the under-cut fabrication process is retained as a permanent structure in a completed structure (e.g., an electronic or micromechanical device).

In one specific embodiment, the pattern generated by the under-cut fabrication process forms electrodes of a TFT structure that are separated by a channel whose length is equal to the under-cut distance. First, a gate structure (electrode) is formed on a substrate and covered with a suitable dielectric, then a first metal layer is deposited on the dielectric. The mask is then formed on the first metal such that the side edge of the window is generally located over the gate structure. The exposed portion of the first metal layer is then etched (i.e., removed) to expose the underlying dielectric, and the etching process is allowed to proceed in a controlled manner to produced a desired amount of over-etching (i.e., undercutting) such that an edge of the remaining first metal layer is offset from an edge of the mask by a predetermined under-cut distance. A second metal layer is then deposited (e.g., sputtered) over the mask and onto the exposed dielectric such that a portion of the second metal layer is co-planar with the first metal layer, and an edge of this second metal layer portion is spaced from the over-etched first metal layer portion by the predetermined gap distance. The mask is then removed, and a suitable semiconductor material is deposited into the gap formed between the two remaining metal layer structures, thereby producing a thin film transistor.

In accordance with another aspect of the present invention, the pattern generated by the under-cut fabrication process is utilized as a temporary structure, and is removed before a desired end structure is completed.

BRIEF DESCRIPTION OF THE DRAWINGS

These and other features, aspects and advantages of the present invention will become better understood with regard to the following description, appended claims, and accompanying drawings, where:

FIG. 5 is a top view showing an active switch matrix formed in accordance with another embodiment of the present invention;

FIGS. 6(A), 6(B), 6(C) and 6(D) are cross-sectional side views showing a fabrication process for producing the active switch matrix of FIG. 5 according to another embodiment of the present invention;

DETAILED DESCRIPTION OF THE DRAWINGS

FIGS. 1(A) through 1(E) are simplified cross-sectional side views showing a fabrication process according to a general embodiment of the present invention.

Figure 1A:
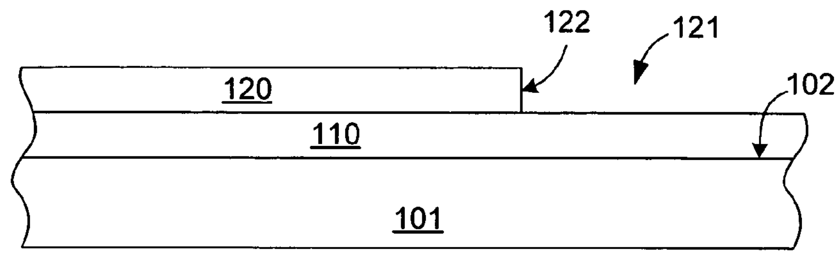
FIGS. 1(A), 1(B), 1(C), 1(D), and 1(E) are simplified cross-sectional side views showing a fabrication process according to the present invention.

Referring to FIG. 1(A), the fabrication process begins by forming a first layer 110 on a surface 102, which may be the upper surface of a substrate 101, or may be the upper surface of a layer formed on an underlying substrate. A mask 120 is then formed on the first layer using a selected feature patterning (e.g., lithographic) tool such that mask 120 defines a window 121 having a side edge 122. Thus, a first portion of first layer 110 is covered (masked) by mask 120, while a second portion of first layer 110 is exposed through window 121. Note that the selected feature patterning tool may include a standard photolithographic system, but may also include less expensive, relatively low resolution feature patterning tools such as those used to generate jet printed features from electronic files (e.g., wax inkjet printing methods disclosed in co-owned U.S. Pat. No. 6,742,884, entitled "Apparatus For Printing Etch Masks Using Phase-Change Materials", which is incorporated herein by reference in its entirety).

Figure 1B:
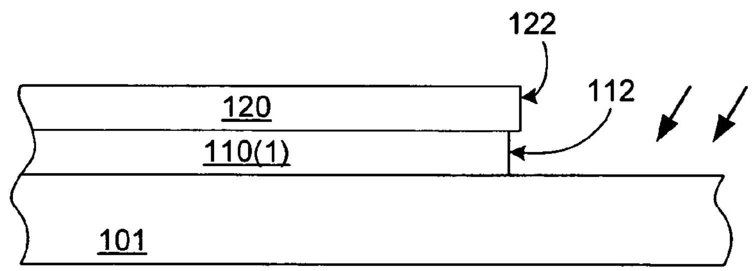

Referring to FIG. 1(B), the exposed portion of first layer 110 is then etched through window 121, whereby the exposed portion of first layer 110 is essentially entirely removed, and a masked portion 110(1) having a side edge 112 is retained under mask 120. Note that side edge 112 of retained portion 110(1) may be substantially aligned with side edge 122 of mask 120, or may be slightly under-cut, as indicated in FIG. 1(B), depending on the selected etching process.

Figure 1C:
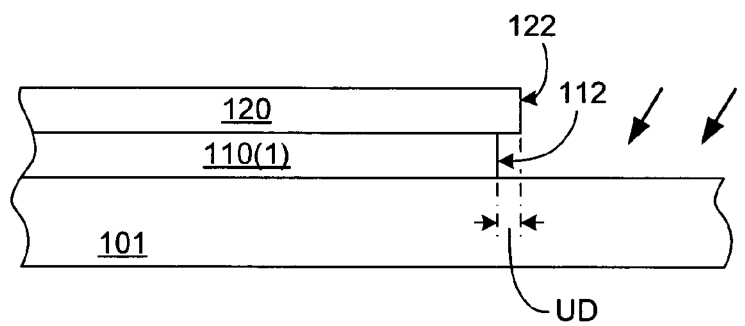

As indicated in FIG. 1(C), according to an aspect of the present invention, the etching process used to remove the exposed portion of the first layer is allowed to continue, or a second etching process is initiated, until side edge 112 is offset from side edge 122 of mask 120 by a predetermined under-cut distance UD. More specifically, under-cut distance UD is achieved by controlled over-etching of the first layer material (i.e., allowing the etching process to proceed for a predetermined period of time) using well-known techniques. Because this under-cutting (over-etching) process is highly developed, accurately achieving the targeted under-cut distance UD can be done with a high degree of reliability without relying on the resolution of the feature patterning tool used, for example, to form mask 120.

Figure 1D:
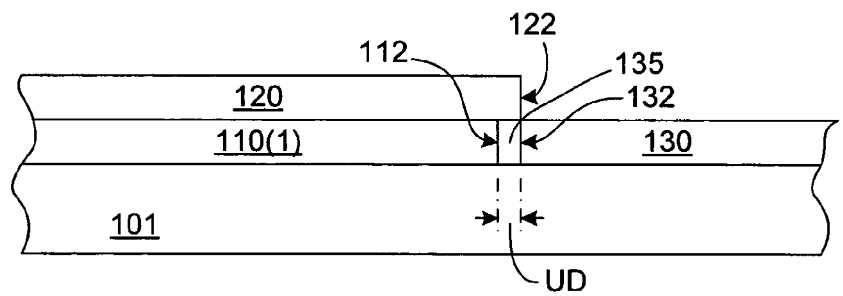

Referring to FIG. 1(D), the fabrication process next involves depositing (e.g., sputtering or plating) a second layer 130 on the exposed portion of surface 102 such that a side edge 132 of second layer 130 is substantially aligned with side edge 122 of mask 120. Note that a gap 135 is defined between side edge 112 of first layer portion 110(1) and side edge 132 of second layer 130 that is equal to under-cut distance UD.

Figure 1E:
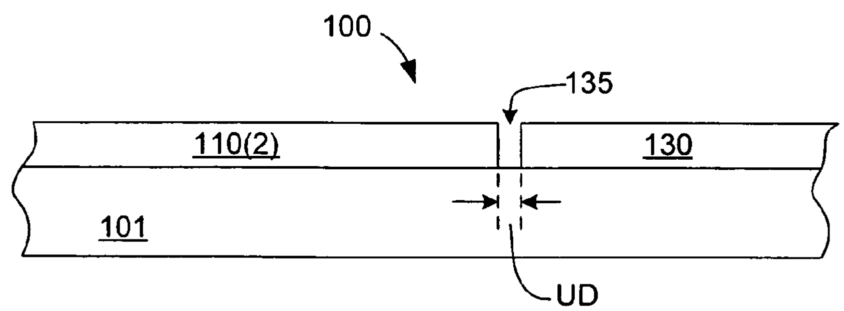

Finally, as shown in FIG. 1(E), mask 120 is removed (along with the portion of the second layer, if any, that is formed thereon), thereby completing the fabrication of a co-planar pattern 100 including first layer portion 110(1) and second layer 130 separated by gap 135. Note that in some instances it may be desirable to retain mask 120, and therefore the removal of mask 120 is considered optional.

Because the controlled under-cutting process depicted in FIGS. 1(A) through 1(E) is entirely independent of the feature patterning tool used, for example, to define mask window 121, the present invention provides a highly reliable method for producing patterns, such as co-planar pattern 100, that includes pattern features (e.g., gap 135) that are smaller that the resolution limits of the feature patterning tool. Therefore, the present invention facilitates the fabrication of integrated circuits having relatively high resolution features using relatively low resolution feature patterning tools that is both economical and reliable.

In some embodiments pattern 100 (FIG. 1(E)) may represent a completed structure, but in most instances represent an intermediate structure that is utilized during subsequent fabrication steps to form a completed product (for example, an electrical element or a micromechanical structure). Further, when utilized as an intermediate structure, pattern 100 may become a permanently retained portion of the completed structure, or may be temporarily utilized and then removed before completion of the structure. In addition, according to alternative embodiments, first layer 110 and second layer 120 may comprise the same material (e.g., both the first and second layers are copper), or may comprise different materials (e.g., the first layer is copper and the second layer is gold). In other alternative embodiments, the first and second layers may comprise electrically conductive or non-conductive materials. Several exemplary embodiments are provided below that set forth these various uses of pattern 100.

Figure 2A:
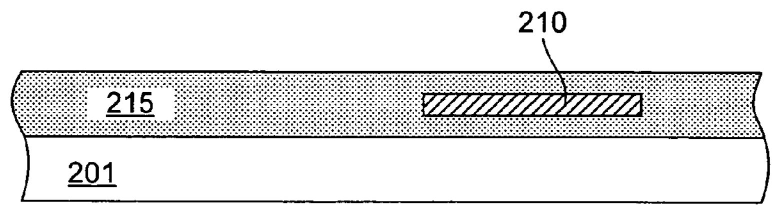
FIGS. 2(A), 2(B), 2(C), 2(D), 2(E), 2(F) and 2(G) are simplified cross-sectional side views showing a transistor fabrication process according to a specific embodiment of the present invention.
Figure 2B:
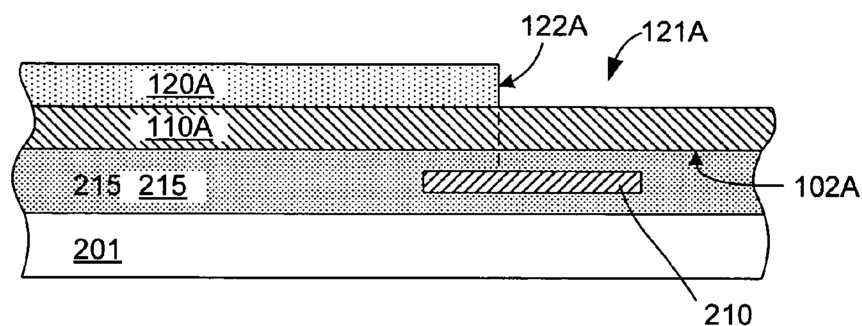
Figure 2C:
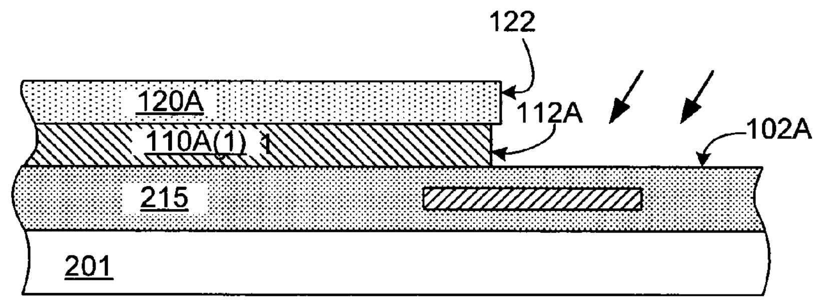
Figure 2D:
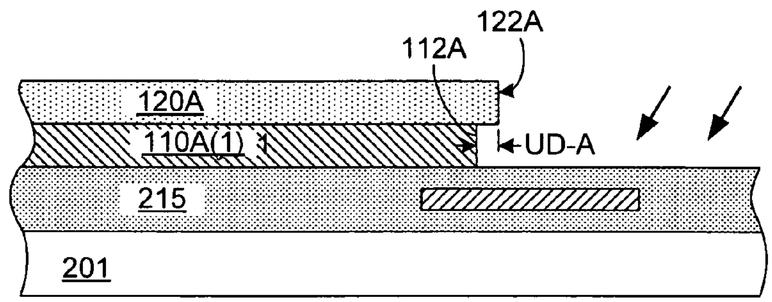
Figure 2E:
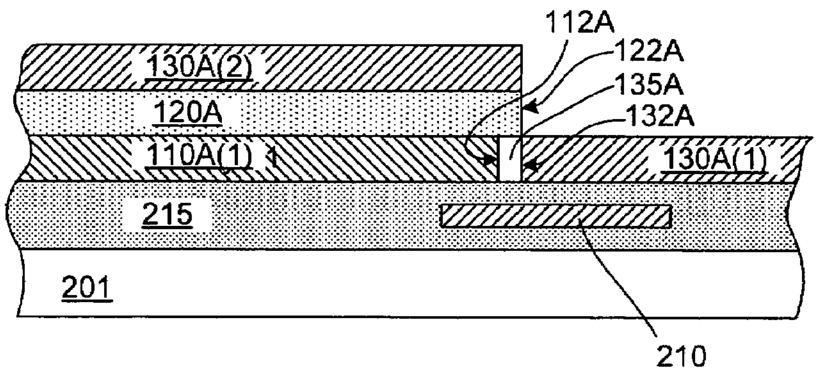
Figure 2F:
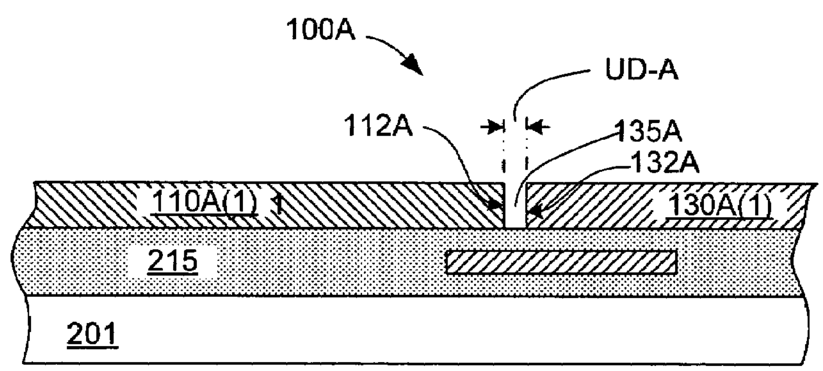
Figure 2G:
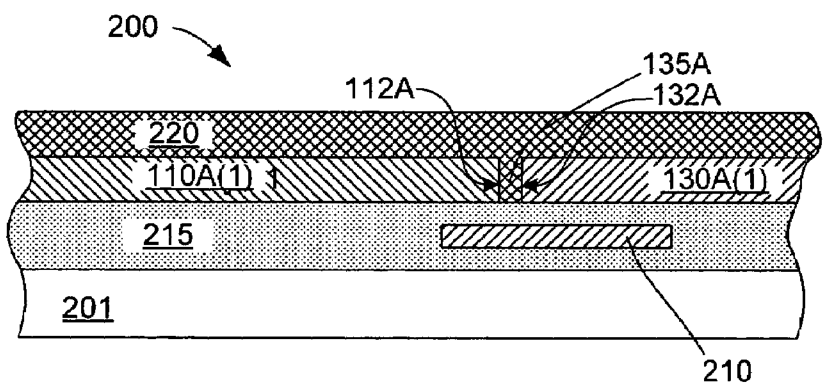

FIGS. 2(A) through 2(G) are simplified cross-sectional side views showing a first exemplary embodiment in which the pattern formed using the general fabrication process (described above) is utilized to form a simplified field effect transistor (FET) structure. Referring to FIG. 2(A), a gate structure (electrode) 210 is formed according to known techniques over a substrate 201, and a dielectric material layer 215 is formed over gate structure 210. In FIG. 2(B), a first metal layer 110A is formed on a surface 102A of dielectric layer 215, and a mask 120A is formed on first metal layer 110A and defines a window 121A having a side edge 122A that is located over gate structure 210 (as indicated by the dashed vertical line). Referring to FIGS. 2(C) and 2(D), etching is then performed in the manner described above to remove exposed portions of dielectric layer 215A, and to under-cut mask 120A until a side edge 112A of first layer portion 110A(1) is offset from side edge 122A of mask 120A by a predetermined under-cut distance UD-A. As indicated in FIG. 2(E), a second metal layer is then formed that includes a first portion 130A(1) formed on the exposed portion of dielectric layer 215A, and a second portion 130A(2) on mask 120A. Note that both side edge 112A of first layer 110A(1) and the side edge 132A of the second layer portion 130A(1) are positioned over gate structure 210. Next, as indicated in FIG. 2(F), second layer portion 130A(2) and mask 120A are removed (e.g., lifted off) to complete pattern 100A. Similar to pattern 100 (described above), pattern 100A includes first layer portion 110A(1) and second layer portion 130A(1) arranged such that a side edge 112A is separated from side edge 132A by gap 135A, where gap 135A has a width that is equal to predetermined under-cut distance UD-A. Finally, as indicated in FIG. 2(G), a semiconductor material layer 220 (e.g., an organic semiconductor such as solution processable polythiophene is formed over first layer portion 110A(1), second layer portion 130A(1), and into the gap 135, thereby forming a transistor 200. During subsequent operation, a gate voltage transmitted in gate structure 210 that causes a current to flow, for example, through semiconductor material layer 220 from a first electrode formed by first layer portion 110A(1) to a second electrode formed by second layer portion 130A(1).

Figure 3:
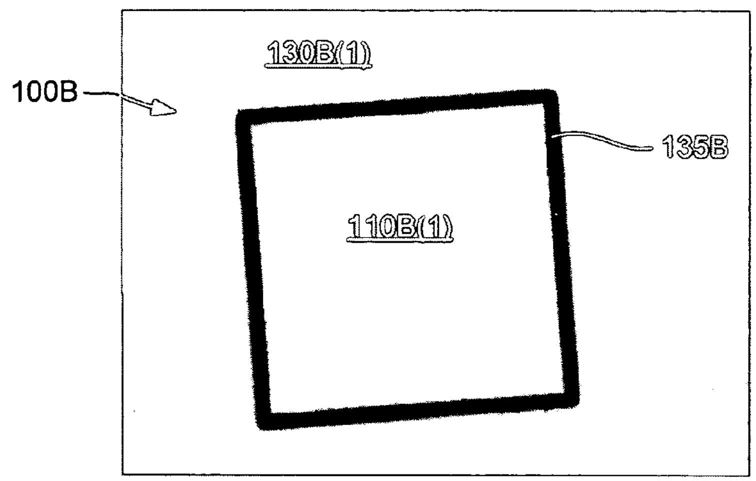
FIG. 3 is a microscope photograph showing a pattern formed in accordance with an embodiment of the present invention.
Figure 4A:
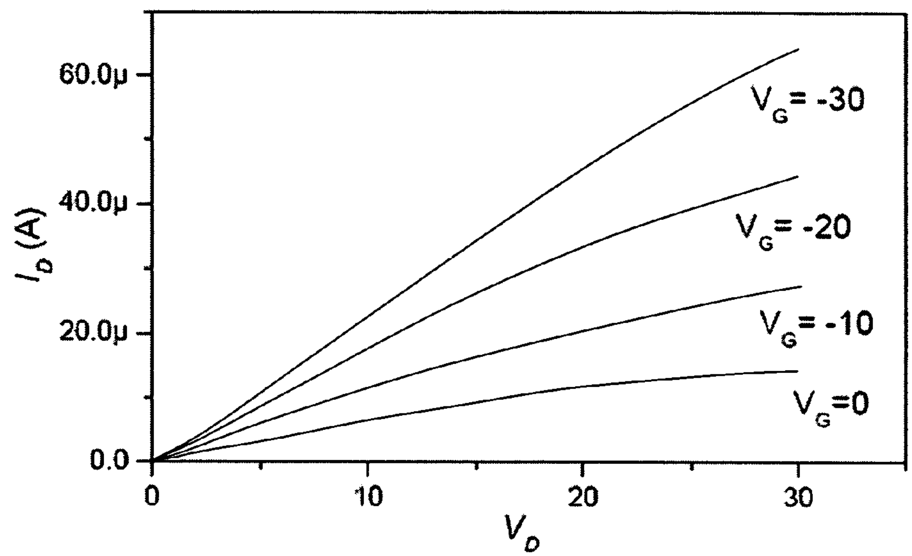
FIGS. 4(A) and 4(B) are graphs showing transistor transfer and output characteristic curves for a transistor formed in accordance with the embodiment shown in FIG. 3.
Figure 4B:
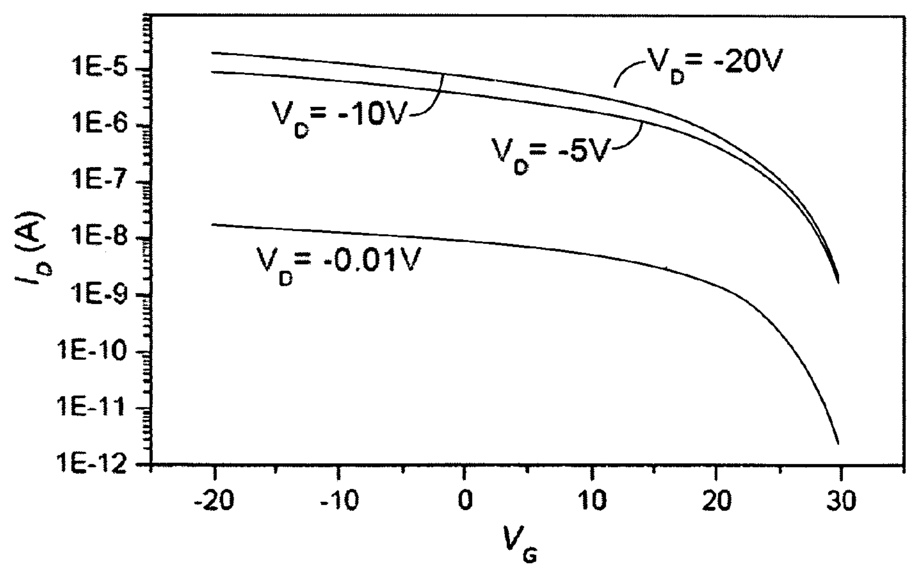

FIG. 3 is a microscope picture of a pattern 100B before spin-on organic semiconductor processed as described in FIG. 1. Pattern 100B includes a well-defined, 2 μm gap 135B separating a first gold electrode 110B(1) and a second gold electrode 130B(1). A complete TFT device can be fabricated using structure 100B by coating gap 135B with organic semiconductor material. Transistor transfer and output characteristic curves are shown in FIGS. 4(A) and 4(B), respectively. To simplify the process of demonstrating working TFTs, device formed using pattern 100B use a doped silicon wafer substrate, which is doubled as the function of gate. Such TFTs currently exhibit a high positive threshold voltage shift, which the present inventors believe is not a systematic characteristic associated with the fabrication process. Note that the width-to-length (W/L) ratio of this particular device is 400/5, and the device occupies an area of only 100×100 $um^2$. More than 0.05 mA on-current is achieved despite the fact that the mobility of this particular transistor is only moderate, around 0.014 $cm^2/Vs$.

The fabrication process described above with reference to FIGS. 2(A) through 2(G) is simplified to illustrate fundamental concepts associated with the present invention. Those skilled in the art will recognize that, if expanded to generate multiple TFTs, the simplified process would produce the multiple TFTs connected source/drain contacts. In order to produce functional circuits (e.g., an active switch matrix), a second resist mask can be overlaid on top of the first resist pattern before depositing the second metal layer.

FIGS. 5 and 6(A) through 6(D) illustrate the two-mask approach for forming functional circuits according to another exemplary embodiment of the present invention. As illustrated in FIGS. 5 and 6(A), after using first mask portions 120 to etch the first metal to form separate first layer portions (e.g., first layer portions 110C(1) and 110C(2)), second masks 520 are formed between the separated first layer portions. Next, as indicated in FIG. 6(B), second layer portions 130C(1) and 130C(2) are deposited on dielectric layer 215C as described above, and also on first mask portions 120C(1) and 120C(2), and on second mask portion 520(1). As indicated in FIG. 6(C), the first and second masks are then removed (along with the second layer portions formed thereon), thereby forming a pattern 100C that includes sub-resolution gaps separating associated first and second layer portions, and exposed regions of dielectric layer 215C (e.g., surface region 201C) that separate adjacent second layer structures. In particular, a first gap 135C(1) separates first layer portion 110C(1) and second layer portion 130C(1), a second gap 135C(2) separates first layer portion 110C(2) and second layer portion 130C(2), and second layer portions 130C(1) and 130C(2) are separated by surface region 201C. Finally, as indicated in FIG. 6(D), electrically separated TFT structures are formed by patterning semiconductor material into the sub-resolution gaps. For example, a first TFT 200C1 includes gate structure (electrode) 210C(1), first layer portion 110C(1), second layer portion 130C(1), and semiconductor portion 220C(1), and a second TFT 200C2 includes gate structure (electrode) 210C(2), first layer portion 110C(2), second layer portion 130C(2), and semiconductor portion 220C(2).

Figure 7:
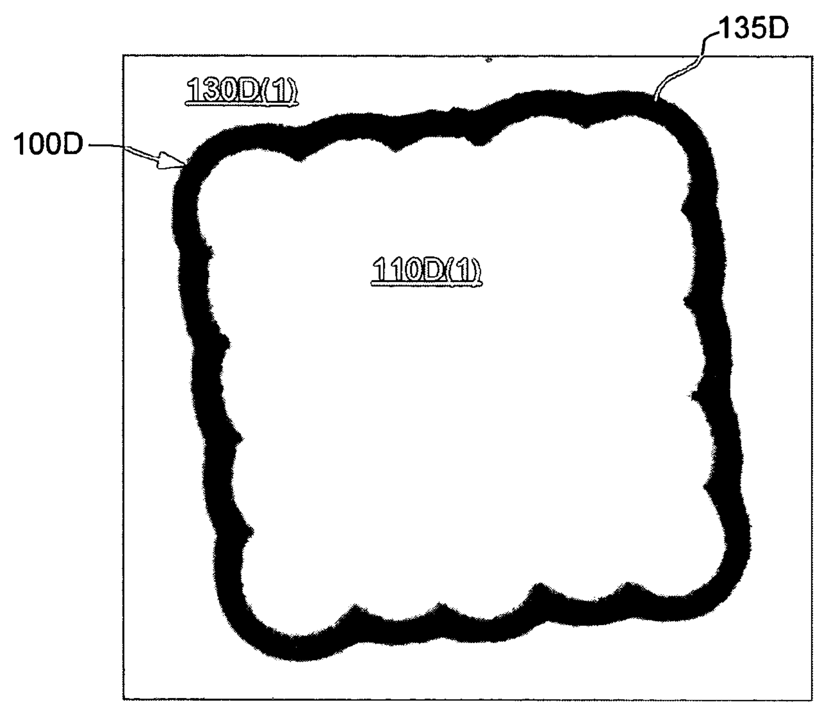
FIG. 7 is a microscope photograph showing a pattern formed in accordance with an embodiment of the present invention.

For the simplicity of demonstrating the fabrication process of the present invention, traditional photolithography was used to define patterns shown in FIG. 2. However, TFTs have also been formed using true low-cost, low resolution patterning technique has also been realized. For example, FIG. 7 shows a pattern 100D in which gold electrodes 110D(1) and 130D(1) are separated by a gap (channel) 135D that is formed by wax inkjet printing methods using techniques described in co-owned and co-pending U.S. patent application Ser. No. 10/224,701, entitled "Method For The Printing Of Homogeneous Electronic Material With A Multi-Ejector Print Head", which is incorporated herein by reference in its entirety. Note that the length of gap (channel) 135D is less than the pattern roughness due to the printing process.

As described in previous paragraphs, the fabrication process of the present invention may be used to produce transistors with channel lengths that are not limited by the resolution limits of feature patterning tools. High driving current for active switch matrix and high switching speed can therefore be achieved for logic circuits with only low cost equipment.

Figure 8:
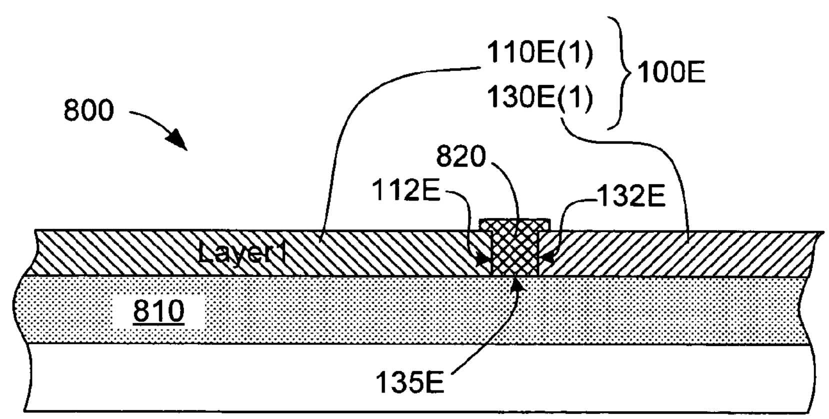
FIG. 8 is a cross-sectional side view showing a resistor formed in accordance with another embodiment of the present invention.

In addition to generating transistors, the fabrication process may also be utilized to form other electronic elements and micromechanical structures. For example, FIG. 8 shows a resistor 800 formed by a pattern 100E and a deposited resistive material portion 820. In particular, resistive material portion 820 is located in a gap 135E separating electrodes 110E(1) and 130E(1), which are formed in the manner described above on an insulating layer 810. During operation, an applied current passes between electrodes 110E(1) and 130E(1) through resistive material portion 820 in a manner well known in the art. Those skilled in the art will recognize that the fabrication process can be utilized in a similar manner to produce other electronic elements (e.g., photosensors).

Figure 9A:
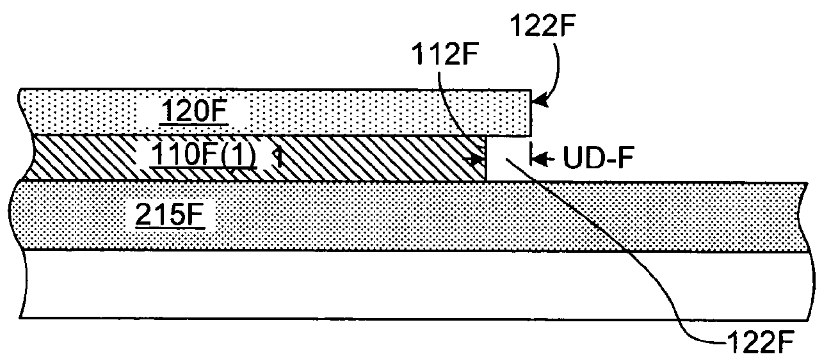
FIGS. 9(A), 9(B), 9(C) and 9(D) are cross-sectional side views showing a fabrication process for producing a plated pattern according to another embodiment of the present invention.
Figure 9B:
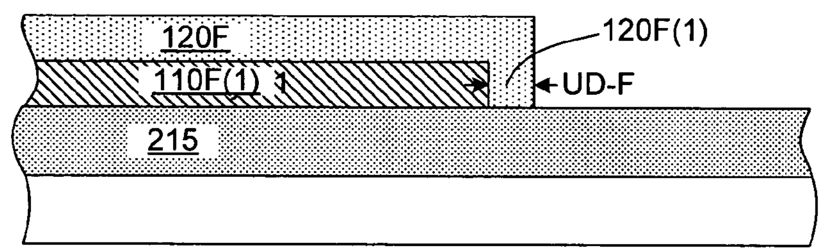
Figure 9C:
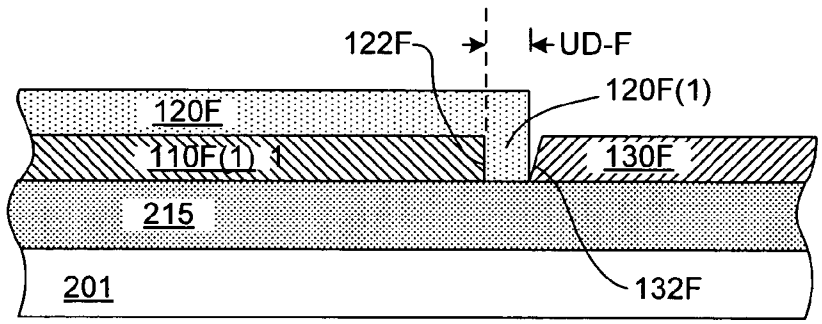
Figure 9D:
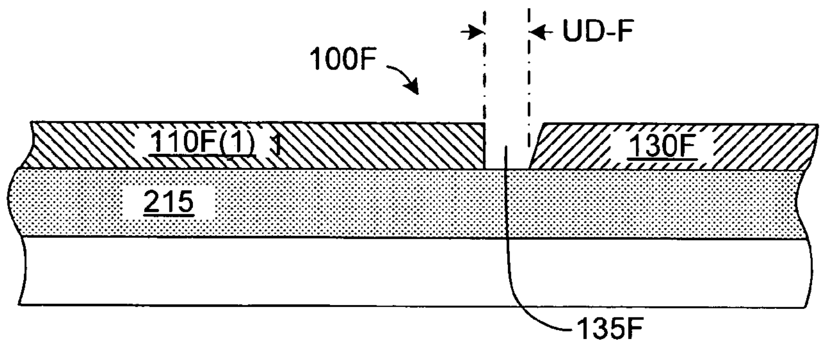

The pattern layers formed using the under-cut fabrication process of the present invention may be formed using low-cost plating, as opposed to relatively expensive sputter deposition. FIGS. 9(A) through 9(D) illustrate the formation of a pattern 100F (FIG. 9(D)) using plating techniques according to another exemplary embodiment of the present invention. FIG. 9(A) depicts first layer 110F(1) formed on an insulating layer 215F after under-cutting such that a side edge 112F is offset from side edge 122F of mask 120F by an under-cut distance UD-F. As depicted in FIG. 9(B), mask 120F is then reflowed (i.e., heated to its melting point), thereby causing overhanging portion 120F(1) to collapse onto insulating layer 215F (i.e., to cover side edge 112F of first layer portion 110F(1)). With this section of insulating surface 215F covered, as indicated in FIG. 9(C), a suitable plating method (e.g., electroless-plating or electroplating) may be utilized to form second layer 130F such that side edge 135F is offset from side edge 112F of first layer 110F(1) by predetermined under-cut distance UD-F. Finally, as shown in FIG. 9(D), mask 120F is removed, thereby forming gap 135F and completing pattern 100F.

As mentioned above, in addition to forming a permanent structure that is incorporated into an electronic element or other structure, patterns formed using the fabrication process described herein may also be used as temporary (e.g., mask) structures during the fabrication of such electronic element and other structures.

Figure 10:
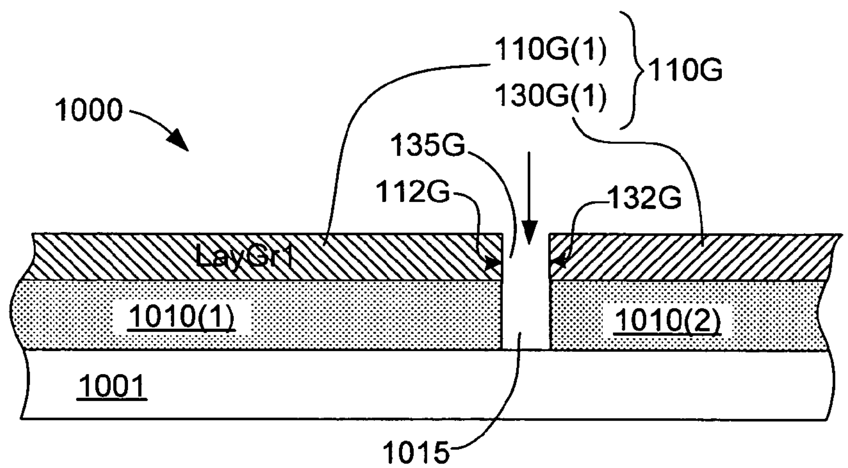
FIG. 10 is cross-sectional side view depicting the use of a pattern formed in accordance with the present invention as an etch mask.
Figure 11:
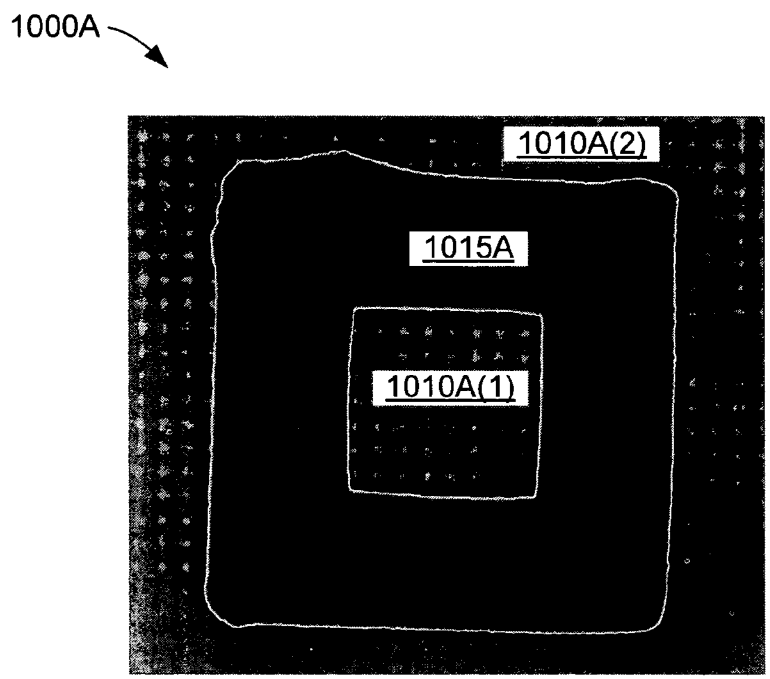
FIG. 11 is a microscope photograph showing a pattern formed in accordance with the etching process described with reference to FIG. 10.

FIG. 10 is a cross-sectional side view depicting the use of a pattern 100G as an etch mask to form an etched structure 1000. At least one layer is formed on a substrate 1001 before forming and etching first layer portion 110G(1) and 130G(1) according to the methods described above. Upon completing pattern 100G, the underlying layer(s) is etched according to known techniques to separate this layer into two or more sections (identified as sections 1010(1) and 1010(2)) that are separated by a space 1015. FIG. 11 shows a micrograph of gold electrodes 1010A(1) and 1010A(2) with 30 μm space 1015A that are defined by using Cr as first and second metal layers 110G(1) and 130G(1) (see FIG. 10), and then transferring to the underlying Au layer by wet chemical etching. Wet chemical etching of Cr has superior under-cut controllability than directly etching Au. Using this process, well-defined straight edge can still be achieved even with 30 μm under-cut. It is also possible to avoid using lift-off process, which is not very popular in large-area electronics industry. "Negative tone" process such as electro or electroless plating, chemical etching inhibitor (e.g., self-assembled monolayer—SAM) can also be used to achieve the same effect of the fabrication process described herein. For example, the reflow methodology shown in FIGS. 9(A) and 9(B) (discussed above) may be used to mask an underlying Au layer (i.e., layer 215 is Au), followed by the application of a SAM (e.g., an alkanethiolate or other organothiol), which will only assemble on the Au surface. The mask is then removed as depicted in FIG. 9(D), and then the Au layer is etched through the resulting gap in the manner depicted in FIG. 10 (i.e., with layer 1010 being the Au layer, and layer 130G(1) being the SAM).

Figure 12A:
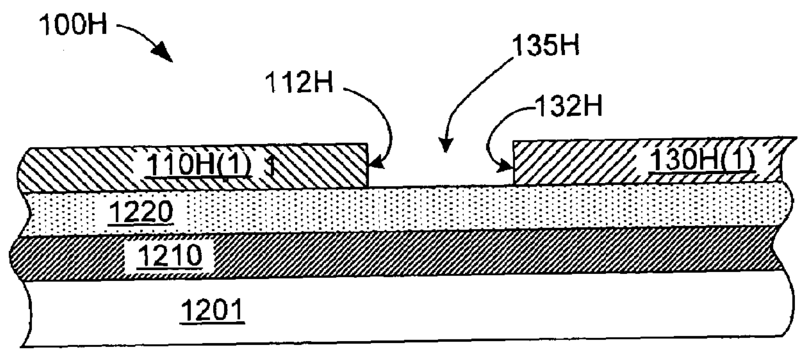
FIGS. 12(A), 12(B), 12(C), 12(D), 12(E) and 12(F) are simplified cross-sectional side views showing a transistor fabrication process according to a specific embodiment of the present invention.
Figure 12B:
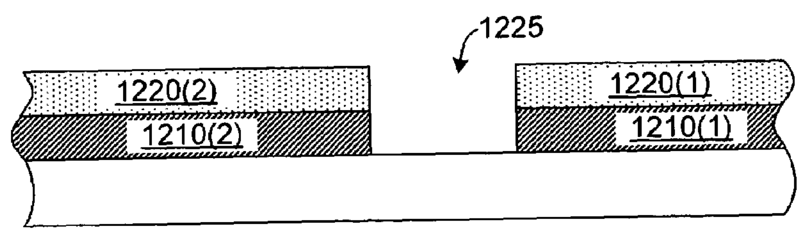
Figure 12C:
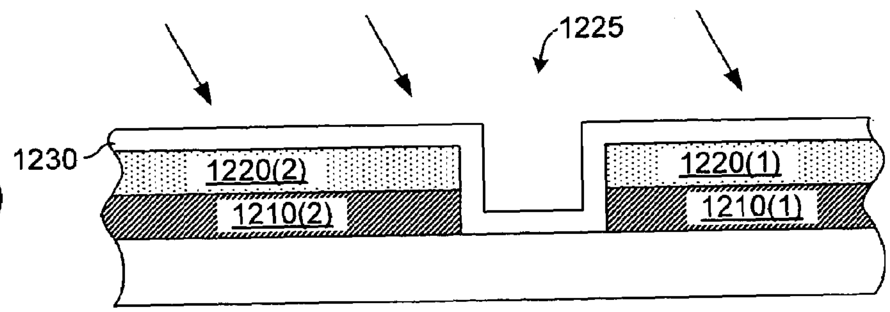
Figure 12D:
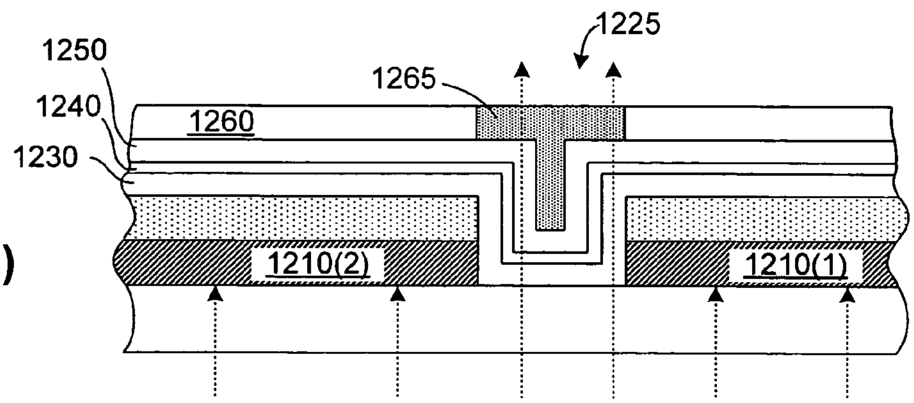
Figure 12E:
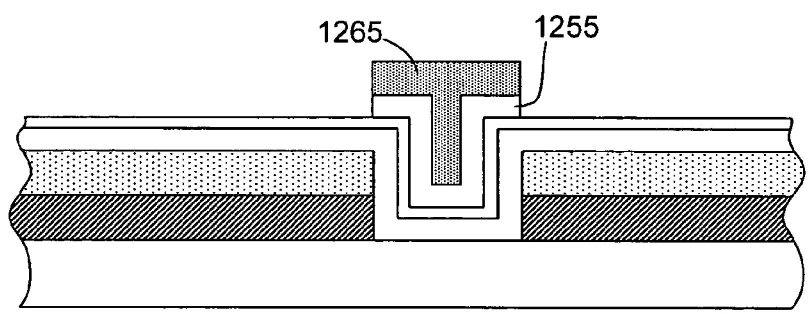
Figure 12F:
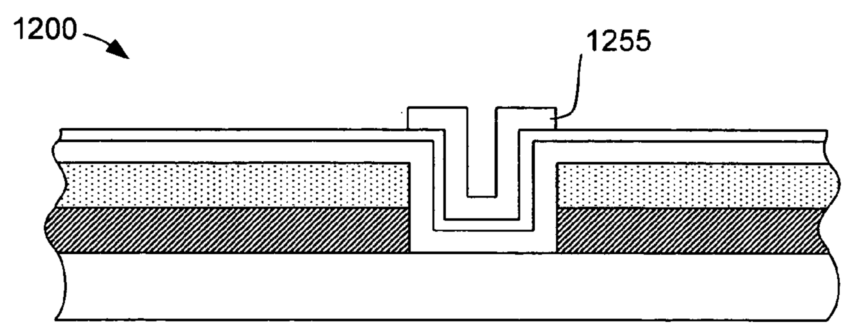

FIGS. 12(A) through 12(F) are cross-sectional side views showing the formation of an Excimer Laser Annealed (ELA) poly-Si TFT according to another embodiment of the present invention. Referring to FIG. 12(A), a TiW (third) layer 1210 and a doped silicon (fourth) layer are sequentially formed on a suitable substrate 1201, and then a pattern 100H is formed in the manner described above, and includes first layer portion 110H(1) and second layer 130H(1) formed such that a gap 135H is defined between opposing side edges 112H and 132H. Next, as depicted in FIG. 12(B), TiW layer 1210 and doped silicon layer 1220 are wet etched in the manner described above with reference to FIG. 10 to define a space 1225 separating first sections 1210(1) and 1220(1) from second sections 1210(2) and 1220(2). Layer portions 110H(1) and 130H(1) are subsequently removed. Referring to FIG. 12(C), an amorphous silicon (a-Si) semiconductor layer 1230 is then deposited into space 1225 between the first and second sections, and then laser annealed using known techniques to form poly-crystalline Si. Next, referring to FIG. 12(D), a dielectric layer (e.g., an oxide) 1240 is formed over semiconductor layer 1230, and a gate material layer 1250 (e.g., doped Si) is formed over dielectric layer 1240. Referring to FIG. 12(E), a mask layer 1260 is then formed over gate layer 1250, and exposed using back-side radiation (indicated by arrows) to develop a region 1265 of mask 1260 that is located over space 1225 (i.e., aligned with side edges of TiW layer portions 1210(1) and 1210(2)). Note that TiW layer portions 1210(1) and 1210(2) serve as a mask during the back-side radiation process. Next, as shown FIG. 12(E), non-exposed (undeveloped) portions of the mask are removed (leaving only mask portion 1265) along with underlying portions of the gate layer, thereby forming a gate structure 1255 located over space 1225. Finally, as shown in FIG. 12(F), mask portion 1265 is removed, thereby completing transistor structure 1200.

Although the present invention has been described with respect to certain specific embodiments, it will be clear to those skilled in the art that the inventive features of the present invention are applicable to other embodiments as well, all of which are intended to fall within the scope of the present invention. For example, a "top-gate" transistor structure, similar to ELA poly-Si TFT 1200 of FIG. 12(F), may be fabricated by forming a gate structure or other electrode similar to that shown in FIG. 12(F), for example, over electrodes 110A(1) and 130A(1) of FIG. 2(F) (i.e., eliminating the "bottom" gate structure 210 and dielectric layer 215.

The invention claimed is:

1. A fabrication process comprising: forming a first layer on a surface, the first layer having an upper surface; forming a mask in contact with the upper surface of the first layer such that the mask defines window having a substantially vertical side edge and exposes a portion of the upper surface of the first layer, the side edge extending from the upper surface portion of the first layer to an upper surface of the mask; etching the first layer through the window until a side edge of the first layer is offset from the side edge of the mask by an undercut distance; and forming a second layer on the surface such that side edge of the second layer is aligned with the side edge of the mask, thereby defining a gap between the first and second layers that is equal to the undercut distance.

2. The fabrication process according to claim 1, further comprising removing the mask, thereby providing a co-planar pattern including the first layer and the second layer separated by the gap.

3. The fabrication process according to claim 1, further comprising:

forming a first electrode; and forming a dielectric layer over the first electrode, wherein the first layer is formed on an upper surface of the first electrode, and wherein both the side edge of the first layer and the side edge of the second layer are positioned over the first electrode.

4. The fabrication process according to claim 3, further comprising depositing a semiconductor material into the gap.

5. The fabrication process according to claim 3, further comprising forming a second mask over a portion of the first mask after etching the first metal layer, wherein forming the second layer comprises depositing a portion of the second layer on the second mask.

6. The fabrication process according to claim 5, further comprising removing the portions of the second layer formed on the second mask, thereby exposing portions of the surface.

7. The fabrication process according to claim 1, wherein forming the mask comprises jet printing.

8. The fabrication process according to claim 1, wherein forming the first layer comprises depositing a first metal layer, wherein forming the second layer comprises depositing a second metal layer, and wherein the fabrication process further comprises depositing an electrically resistive material into the gap defined between the side edge of the first metal layer and the side edge of the second metal layer.

9. The fabrication process according to claim 1, further comprising reflowing the mask after etching the first layer such that a portion of the mask covers the side edge of the first layer, wherein forming the second layer comprises plating metal onto the surface.

10. The fabrication process according to claim 1, further comprising:

forming at least one layer before forming the first and second layers; and etching said at least one layer through the gap defined between the side edge of the first layer and the side edge of the second layer.

11. The fabrication process according to claim 10, wherein the first and second layers comprise Cr, wherein said at least one layer comprises gold.

12. The fabrication process according to claim 9, further comprising reflowing the mask after etching the first layer such that a portion of the mask covers the side edge of the first layer, wherein forming the second layer comprises applying a chemical etching inhibitor over exposed portions of said at least one layer after said reflowing.

13. The fabrication process according to claim 9, wherein said at least one layer comprises Au, and wherein said chemical etching inhibitor comprises an organothiol.

14. The fabrication process according to claim 1, further comprising:

forming at least one layer before forming the first layer such that the first and second layers are formed over said at least one layer; and after forming the second layer, etching said at least one layer through the gap, thereby defining a space between first and second sections of said at least one layer.

15. The fabrication process according to claim 14, further comprising:

removing the first and second layers;

depositing a semiconductor layer into the space between the first and second sections of said at least one layer;

depositing a dielectric layer over the semiconductor layer; and forming a third electrode on the dielectric layer over the space between the first and second sections of the third metal layer.

16. The fabrication process according to claim 15, wherein the first and second layers comprise Cr, wherein said at least one layer comprises a third layer comprising TiW and a fourth layer comprising doped silicon formed on the third layer, wherein the semiconductor layer comprises at least one of amorphous silicon and polycrystalline silicon, and wherein the third electrode comprises doped silicon.

17. The fabrication process according to claim 15, wherein forming the third electrode comprises:

forming a conductive layer over the dielectric layer;

forming a mask layer over the conductive layer;

developing a portion of the mask layer located over the space between the first and second sections of the third metal layer by directing radiation through the space; and removing undeveloped portions of the mask layer and portions of the conductive layer located under the undeveloped portions of the mask layer.

18. The fabrication process according to claim 1, further comprising forming a gate structure over the gap defined between the first and second layers.

19. A method for forming coplanar layer portions separated by a sub-resolution gap, the method comprising: forming a stacked structure including a first layer portion and a mask layer in contact with the first layer portion, wherein the mask layer is formed by wax inkjet printing over the first layer portion and defines a window having a first side edge, and wherein a second side edge of the first layer is offset from the side edge of the mask layer by a predetermined undercut distance; and forming a second layer portion such that the second layer portion is coplanar with the first layer portion, and such that a third side edge of the second layer portion is aligned with the first side edge of the mask layer, thereby defining a gap between the first and second layer portions that is equal to the predetermined undercut distance.

20. A fabrication process comprising: forming a first layer on a surface, the first layer: having an upper surface; forming a mask in contact with the upper surface of the first layer, a mask such that the mask defines a window having a substantially vertical side edge and exposes a portion of the upper surface of the first layer, the side edge the side edge extending from the upper surface portion of the first layer to an upper surface of the mask; etching the first layer through the window until the exposed portion of the first layer is essentially entirely removed and a side edge of the first layer is substantially aligned with the side edge of the mask; etching the first layer through the window until the side edge of the first layer is offset from the side edge of the mask by an under-cut distance; and forming a second layer on the surface such that a side edge of the second layer is aligned with the side edge of the mask, thereby defining a gap between the first and second layers that is equal to the undercut distance.

* * * * *

UNITED STATES PATENT AND TRADEMARK OFFICE

CERTIFICATE OF CORRECTION

PATENT NO. : 7,129,181 B2
APPLICATION NO. : 10/943624
DATED : October 31, 2006
INVENTOR(S) : Jeng Ping Lu et al.

It is certified that error appears in the above-identified patent and that said Letters Patent is hereby corrected as shown below:

Column 1, line 3, insert as a new paragraph:

This invention was made with Government support under 70NANB0H3033 awarded by NIST/ATP. The Government has certain rights in this invention.

Signed and Sealed this

First Day of May, 2007

JON W. DUDAS

*Director of the United States Patent and Trademark Office*